United States Patent
Yoo et al.

(10) Patent No.: US 9,806,108 B2
(45) Date of Patent: Oct. 31, 2017

(54) MANUFACTURING METHOD OF THIN FILM TRANSISTOR, MANUFACTURING METHOD OF ARRAY SUBSTRATE AND ARRAY SUBSTRATE

(71) Applicant: BOE TECHNOLOGY GROUP CO., LTD., Beijing (CN)

(72) Inventors: Seongyeol Yoo, Beijing (CN); Seungjin Choi, Beijing (CN); Heecheol Kim, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/430,019

(22) PCT Filed: May 29, 2014

(86) PCT No.: PCT/CN2014/078858
§ 371 (c)(1),
(2) Date: Mar. 20, 2015

(87) PCT Pub. No.: WO2015/096394
PCT Pub. Date: Jul. 2, 2015

(65) Prior Publication Data
US 2016/0027818 A1    Jan. 28, 2016

(30) Foreign Application Priority Data
Dec. 27, 2013   (CN) .......................... 2013 1 0740724

(51) Int. Cl.
| | |
|---|---|
| H01L 29/786 | (2006.01) |
| H01L 27/12 | (2006.01) |
| H01L 29/66 | (2006.01) |
| G02F 1/1362 | (2006.01) |
| G02F 1/1368 | (2006.01) |
| H01L 29/24 | (2006.01) |

(52) U.S. Cl.
CPC ........ *H01L 27/1288* (2013.01); *G02F 1/1368* (2013.01); *G02F 1/136286* (2013.01);
(Continued)

(58) Field of Classification Search
CPC ................. H01L 21/7624; H01L 21/81; H01L 29/78666; H01L 29/78693
(Continued)

(56) References Cited

U.S. PATENT DOCUMENTS

| | | | |
|---|---|---|---|
| 2011/0147735 A1 | 6/2011 | Cheong | |
| 2014/0191228 A1* | 7/2014 | Jung | ................... H01L 29/7869 257/43 |

FOREIGN PATENT DOCUMENTS

| | | |
|---|---|---|
| CN | 1460979 A | 12/2003 |
| CN | 101546077 A | 9/2009 |

(Continued)

OTHER PUBLICATIONS

Sep. 28, 2014 International Search Report for Appn PCT/CN2014/078858 with Eng Tran of Written Opinion.
(Continued)

*Primary Examiner* — Cuong Q Nguyen
(74) *Attorney, Agent, or Firm* — Banner & Witcoff, Ltd.

(57) ABSTRACT

A manufacturing method of a thin film transistor, a manufacturing method of an array substrate and an array substrate are provided. The manufacturing method of the thin film transistor comprises: forming an active layer, a source electrode and a drain electrode on a substrate by one patterning process, the active layer, the source electrode and the drain electrode being located in a same layer. The manufacturing method of the thin film transistor can effectively reduce the number of patterning processes, so as to enhance the capacity in mass production, and reduce the cost.

16 Claims, 7 Drawing Sheets

(52) U.S. Cl.
CPC .......... *H01L 27/124* (2013.01); *H01L 27/127* (2013.01); *H01L 27/1225* (2013.01); *H01L 29/24* (2013.01); *H01L 29/66969* (2013.01); *H01L 29/7869* (2013.01); *H01L 29/78618* (2013.01); *G02F 2001/136295* (2013.01)

(58) Field of Classification Search
USPC ........................................................ 438/104
See application file for complete search history.

(56) References Cited

FOREIGN PATENT DOCUMENTS

| | | |
|---|---|---|
| CN | 102237411 A | 11/2011 |
| CN | 102629591 A | 8/2012 |
| CN | 103715094 A | 4/2014 |
| JP | 02027320 A | 1/1990 |
| JP | H0227320 A | 1/1990 |
| JP | H07183520 A | 7/1995 |
| JP | 20037716 A | 1/2003 |
| JP | 200713055 A | 1/2007 |
| WO | 2009031681 A1 | 3/2009 |

OTHER PUBLICATIONS

Dec. 3, 2015—(CN)—First Office Action Appn 201310740724.5 with English Tran.
May 44, 2016—(CN)—Second Office Action Appn 201310740724.5 with English Tran.

\* cited by examiner

US 9,806,108 B2

MANUFACTURING METHOD OF THIN FILM TRANSISTOR, MANUFACTURING METHOD OF ARRAY SUBSTRATE AND ARRAY SUBSTRATE

The application is a U.S. National Phase Entry of International Application No. PCT/CN2014/078858 filed on May 29, 2014, designating the United States of America and claiming priority to Chinese Patent Application No. 201310740724.5 filed on Dec. 27, 2013. The present application claims priority to and the benefit of the above-identified applications and the above-identified applications are incorporated by reference herein in their entirety.

TECHNICAL FIELD

Embodiments of the present invention relate to a manufacturing method of a thin film transistor, a manufacturing method of an array substrate and an array substrate.

BACKGROUND

A thin film transistor liquid crystal display (briefly referred to as TFT-LCD) dominates a field of flat panel display technology, and attracts more attention, due to characteristics such as small size, low power consumption and no radiation.

In the prior art, manufacturing of a thin film transistor generally requires to respectively perform patterning processes on a gate metal layer, a gate insulating layer, an active layer and a source-drain metal layer by using a mask, and each of the patterning processes includes coating photoresist, exposing, developing, etching, stripping, etc.

Thus, the number of the patterning processes is too many, which will directly lead to an increased product cost and a decreased capacity in mass production, and therefore how to further reduce the number of the patterning processes has become a problem of growing concern.

SUMMARY OF THE INVENTION

Embodiments of the present invention provide a manufacturing method of a thin film transistor, a manufacturing method of an array substrate and an array substrate, which can reduce the number of patterning processes, so as to enhance the capacity in mass production, and reduce the cost.

In one aspect, an embodiment of the invention provides a manufacturing method of a thin film transistor, the method comprises forming an active layer, a source electrode and a drain electrode on a substrate by one patterning process, the active layer, the source electrode and the drain electrode is located in a same layer.

In another aspect, an embodiment of the invention further provides an array substrate, comprising: a substrate; a plurality of data lines and a plurality of gate lines crossed each other, formed on the substrate; a plurality of pixel units, defined by the plurality of data lines and the plurality of gate lines crossed each other and arranged in a matrix, wherein each of the plurality of pixel units comprises a thin film transistor and a pixel electrode, the thin film transistor comprises an active layer, a source electrode and a drain electrode disposed in a same layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

Figure 1:
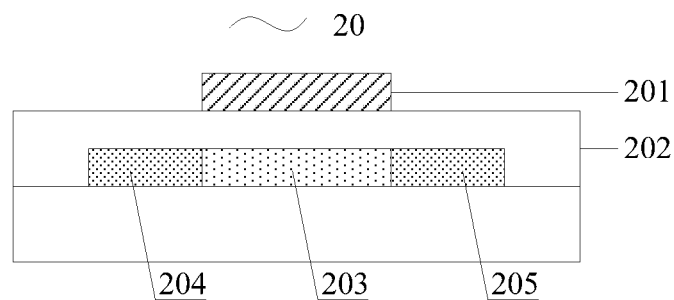
FIG. 1 is a structural schematic diagram of a top gate type thin film transistor provided by an embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides a manufacturing method of a thin film transistor 20, the method comprising: forming an active layer 203, a source electrode 204 and a drain electrode 205 on a substrate by one patterning process, the active layer 203, the source electrode 204 and the drain electrode 205 being located in a same layer.

It should be noted that, firstly, in the embodiment of the invention, one patterning process corresponds to one mask process, i.e., fabricating a certain pattern by using a mask one time is referred to as performing one patterning process.

Secondly, forming the active layer 203, the source electrode 204 and the drain electrode 205 by one patterning process may be performed before a formation of a gate electrode 201 and a gate insulating layer 202, and may also be formed after the formation of the gate electrode 201 and the gate insulating layer 202, of which the specific order is not limited, but depends on actual production situations.

Exemplarily, when the gate electrode 201 and the gate insulating layer 202 are formed formerly, and the active layer 203, the source electrode 204 and the drain electrode 205 are formed later, the thin film transistor 20 is a bottom-gate-type thin film transistor 20; when the active layer 203, the source electrode 204 and the drain electrode 205 are formed formerly, and the gate electrode 201 and the gate insulating layer 202 are formed later, the thin film transistor 20 is the top-gate-type thin film transistor 20.

Exemplarily, for the top-gate-type thin film transistor 20, as shown in FIG. 1, the active layer 203, the source electrode 204 and the drain electrode 205 may be formed firstly by one patterning process, and then the gate insulating layer 202 and the gate electrode 201 are formed by one patterning process. That is, the top-gate-type thin film transistor 20 may be formed by two patterning processes.

Figure 2:
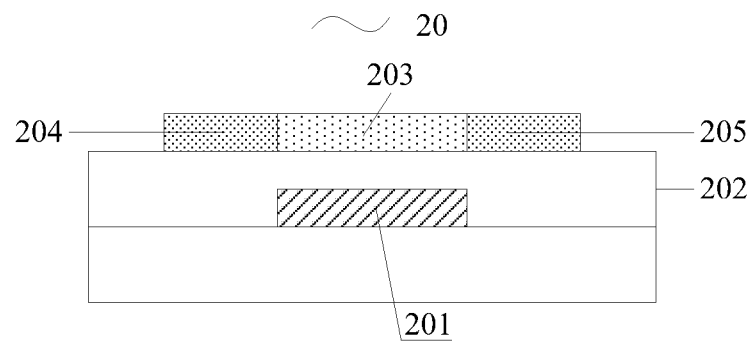
FIG. 2 is a structural schematic diagram of a bottom gate type thin film transistor provided by an embodiment of the invention.
Figure 3A:
FIG. 3(a)~FIG. 3(f) are schematic diagrams for forming a semiconductor active layer, a source electrode and a drain electrode provided by an embodiment of the invention.
Figure 3B:
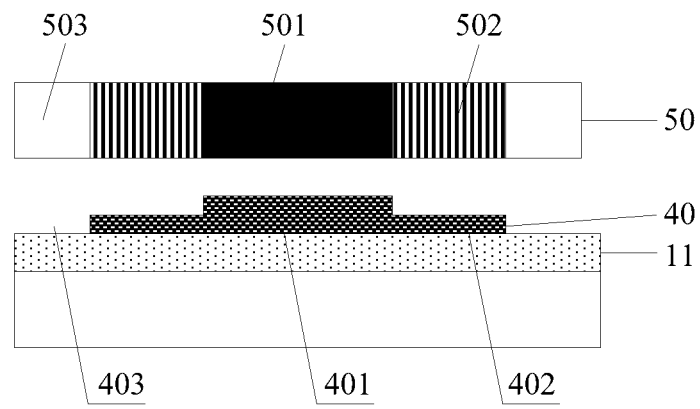
Figure 3C:
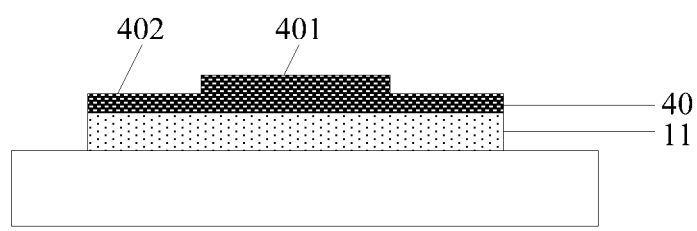
Figure 3D:
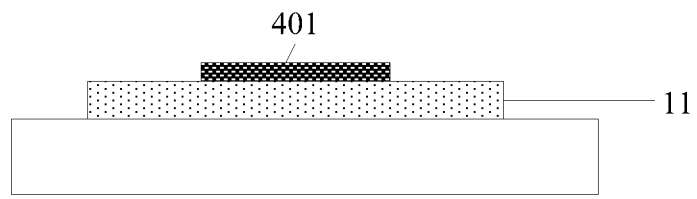
Figure 3E:
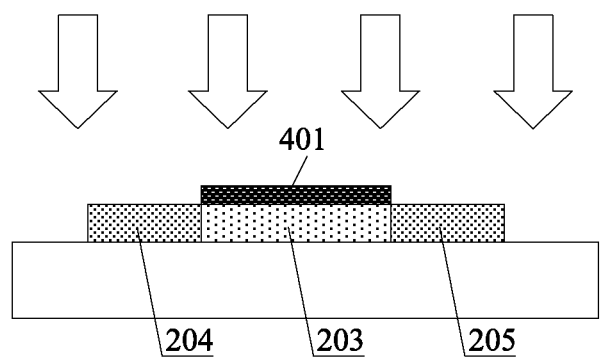
Figure 3F:
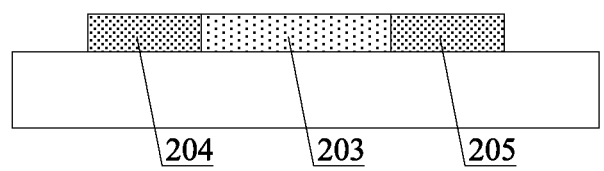

Exemplarily, for the bottom-gate-type thin film transistor 20, as shown in FIG. 2, the gate electrode 201 may be formed firstly by one patterning process, then the gate insulating layer 202 is formed by one patterning process, and then the active layer 203, the source electrode 204 and the drain electrode 205 are formed by one patterning process. That is, the bottom-gate-type thin film transistor 20 may be formed by three patterning processes.

An embodiment of the invention provides a manufacturing method of a thin film transistor 20, the method including: forming an active layer 203, a source electrode 204 and a drain electrode 205 on a substrate by one patterning process, the active layer 203, the source electrode 204 and the drain electrode 205 being located in the same layer. As compared with the prior art, the manufacturing method can effectively reduce the number of the patterning processes, so as to enhance the capacity in mass production, and reduce the cost.

Exemplarily, with reference to FIG. 1, the top-gate-type thin film transistor 20 may be formed by two patterning processes, i.e., the active layer 203, the source electrode 204 and the drain electrode 205 are formed on the substrate by one patterning process, and the gate insulating layer 202 and the gate electrode 201 above the active layer 203, the source electrode 204 and the drain electrode 205 are formed by one patterning process on the substrate on which the active layer 203, the source electrode 204 and the drain electrode 205 are formed.

It should be noted that, since the gate insulating layer 202 comprises a through hole, which, for example, exposes a gate line lead or exposes a data line lead, in a peripheral region of the thin film transistor 20, during forming the gate insulating layer 202, a patterning process requires to be performed to etch and form the through hole located in the peripheral region.

Optionally, as shown in FIG. 3(*a*) to FIG. 3(*f*), the forming an active layer 203, a source electrode 204 and a drain electrode 205 on a substrate by one patterning process, may comprise:

S101: as shown in FIG. 3(*a*), forming a semiconductor thin film 11 on the substrate and forming a photoresist 40 on the semiconductor thin film 11.

S102: as shown in FIG. 3(*b*), exposing and developing the substrate with the photoresist 40 formed thereon by using a multi-tone mask 50, to form a photoresist completely-retained portion 401, a photoresist partially-retained portion 402 and a photoresist completely-removed portion 403.

Herein, the photoresist completely-retained portion 401 corresponds to a region where the semiconductor active layer 203 is to be formed, the photoresist partially-retained portion 402 corresponds to a region where the source electrode 204 and the drain electrode 205 are to be formed, and the photoresist completely-removed portion 403 corresponds to other regions.

Here, with reference to FIG. 3(*b*), illustration of a main principle of the multi-tone mask 50 is provided as follows.

The multi-tone mask 50, by a grating effect, makes intensities of light transmitting through different regions different during exposing, so as to selectively expose the photoresist 40. The multi-tone mask 50 includes an opaque portion 501, a semi-transparent portion 502 and a transparent portion 503. After the photoresist 40 is exposed, the photoresist completely-retained portion 401 corresponds to the opaque portion 501 of the multi-tone mask 50, the photoresist partially-retained portion 402 corresponds to the semi-transparent portion 502 of the multi-tone mask 50, and the photoresist completely-removed portion 403 corresponds to the transparent portion 503 of the multi-tone mask 50.

Herein, the photoresist 40 referred to in all the embodiments of the present invention is a positive photoresist, i.e., in the multi-tone mask 50, a region corresponding to the photoresist completely-removed portion 403 is a completely-exposed region, which corresponds to the transparent portion of the multi-tone mask 50; a region corresponding to the photoresist partially-retained portion 402 is a partially exposed region, which corresponds to the semi-transparent portion of the multi-tone mask 50; and a region corresponding to the photoresist completely-retained portion 401 is an unexposed region, which corresponds to the opaque portion of the multi-tone mask 50.

S103: as shown in FIG. 3(*c*), removing the semiconductor thin film 11 corresponding to the photoresist completely-removed portion 403 by an etching process.

S104: as shown in FIG. 3(*d*), removing the photoresist 40 in the photoresist partially-retained portion 402 by an ashing process.

S105: as shown in FIG. 3(*e*), metallizing the semiconductor thin film 11, so that the exposed semiconductor thin film 11 is transformed into a film having conductor characteristics, to form the source electrode 204 and the drain electrode 205, and the semiconductor thin film 11 corresponding to the photoresist completely-retained portion 401 is not affected by the metallization, to form a semiconductor active layer 203.

Here, the semiconductor thin film 11 which is performed the metallization is a metal oxide thin film and the metal oxide thin film may be a transparent metal oxide material having semiconductor characteristics.

Exemplarily, the transparent metal oxide material having the semiconductor characteristics includes at least one of indium gallium zinc oxide (IGZO), indium gallium oxide (IGO), amorphous indium tin zinc oxide (ITZO) and aluminum zinc oxide (AZO).

S106: as shown in FIG. 3(*f*), removing the photoresist 40 in the photoresist completely-retained portion 401 by a stripping process.

The active layer 203, the source electrode 204 and the drain electrode 205 may be formed on the substrate, by the above-described steps S101-S106. Herein, the source electrode 204 and the drain electrode 205 are made of the film which is metallized so as to have the conductor characteristics, and the semiconductor active layer 203 is made of the metal oxide thin film which is not metallized and has the semiconductor characteristics.

Exemplarily, the method for metallizing the semiconductor thin film 11, may include three modes as follows.

A first mode: placing the substrate with the semiconductor thin film 11 exposed in a vacuum chamber, and heating it to a preset temperature, and maintaining for a preset time then cooling it in the air, wherein the preset temperature is 200~300° C., and the preset time is 20 to 40 minutes.

A second mode: placing the substrate with the semiconductor thin film 11 exposed in a reducing atmosphere, and performing a heat treatment at 200~400° C.

A third mode: placing the substrate with the semiconductor thin film 11 exposed in the vacuum chamber, treating it with hydrogen plasma or oxygen plasma, wherein a pressure of the vacuum chamber is 1,000~2,000 mtorr, and a gas-flow is 5,000~15,000 sccm.

When the semiconductor thin film 11 made of the transparent metal oxide material having the semiconductor characteristics is treated in any one of the above-described three modes, an internal carrier concentration will be increased as a result, and the semiconductor thin film 11 presents the conductor characteristics, so as to form the source electrode 204 and the drain electrode 205. However, the semiconductor thin film 11 which is located under the photoresist 40 and is not metallized has a relatively low carrier concentration, and presents the semiconductor characteristics, so as to form the semiconductor active layer 203.

It should be noted that, the method for metallizing the semiconductor thin film 11 is not limited to the above-described three modes in embodiments of the invention; any mode may be used as long as it is conducive to transform the semiconductor thin film 11 having the semiconductor characteristics into the film having the conductor characteristics.

Figure 4:
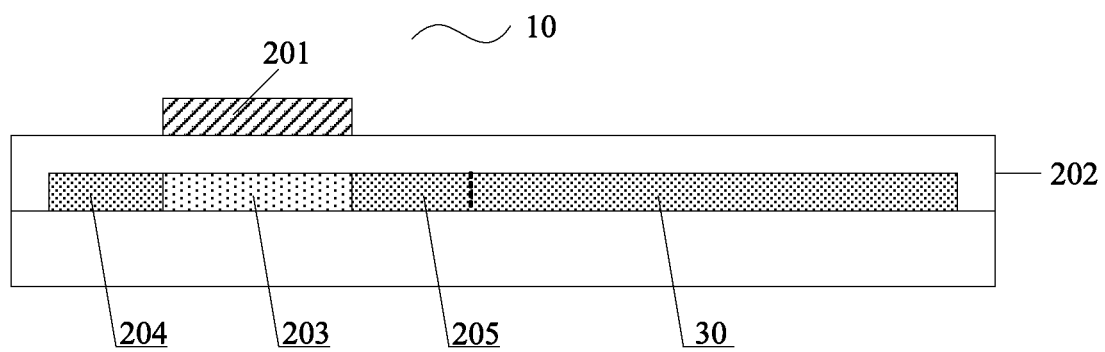
FIG. 4 is a structural schematic diagram of an array substrate provided by an embodiment of the invention.
Figure 5:
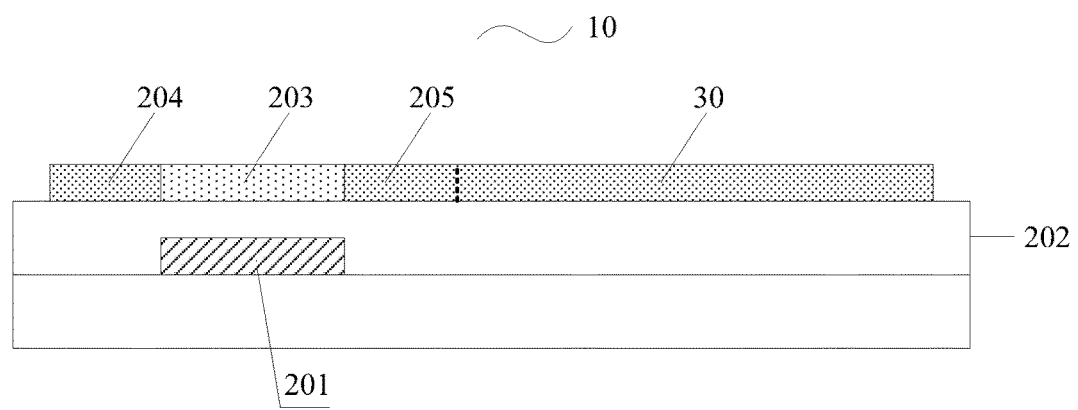
FIG. 5 is another structural schematic diagram of an array substrate provided by an embodiment of the invention.

An embodiment of the present invention further provides a manufacturing method of an array substrate 10, as shown in FIG. 4 and FIG. 5, including manufacturing of a thin film transistor 20 and a pixel electrode 30. Herein, the thin film transistor 20 may be formed by using the above-described method; and the pixel electrode 30 may be formed together with the source electrode 204 and the drain electrode 205.

On this basis, optionally, the pixel electrode 30 connected with the drain electrode 205 and located in the same layer may be further formed, while the active layer 203, the source electrode 204 and the drain electrode 205 located in the same layer are formed on the substrate by one patterning process, wherein the drain electrode 205 and the pixel electrode 30 may be an integral structure and made of the same material.

Here, with reference to FIG. 4, the array substrate 10 may also include a top-gate-type thin film transistor 20; or, with reference to FIG. 5, the array substrate 10 may also include a bottom-gate-type thin film transistor 20.

Since the pixel electrode 30 may be formed together with the active layer 203, the source electrode 204 and the drain electrode 205, in a case that the array substrate 10 includes the top-gate-type thin film transistor 20, the array substrate 10 may be formed by two patterning processes; and in a case that the array substrate 10 includes the bottom-gate-type thin film transistor 20, the array substrate 10 may be formed by three of patterning processes.

Figure 6A:
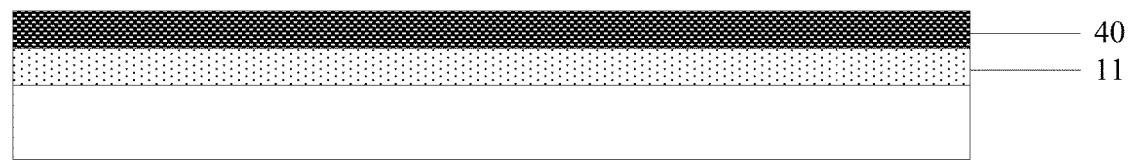
FIG. 6(a)~FIG. 6(h) are schematic diagrams for forming an array substrate provided by an embodiment of the invention.

Optionally, as shown in FIG. 6(a) to FIG. 6(h), the forming the active layer 203, the source electrode 204 and the drain electrode 205 located in the same layer, as well as the pixel electrode 30 connected with the drain electrode 205 on the substrate by one patterning process, may include:

S201: as shown in FIG. 6(a), forming a semiconductor thin film 11 on the substrate and forming photoresist 40 on the semiconductor thin film 11.

Figure 6B:
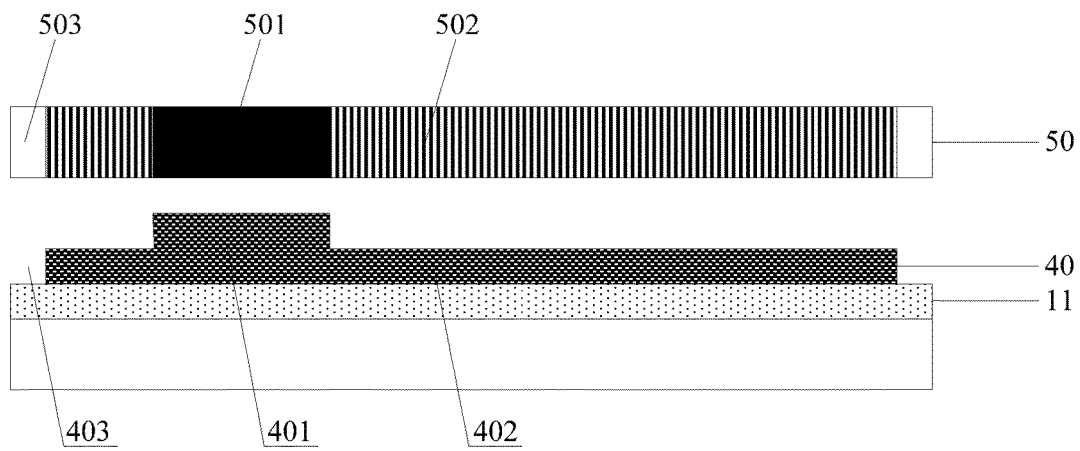

S202: as shown in FIG. 6(b), exposing and developing the substrate with the photoresist 40 formed thereon by using a multi-tone mask 50, to form a photoresist completely-retained portion 401, a photoresist partially-retained portion 402 and a photoresist completely-removed portion 403.

Herein, the photoresist completely-retained portion 401 corresponds to a region where a semiconductor active layer 203 is to be formed, the photoresist partially-retained portion 402 corresponds to a region where the source electrode 204 and the drain electrode 205, as well as the pixel electrode 30 electrically connected with the drain electrode 205 are to be formed, and the photoresist completely-removed portion 403 corresponds to other regions.

Figure 6C:
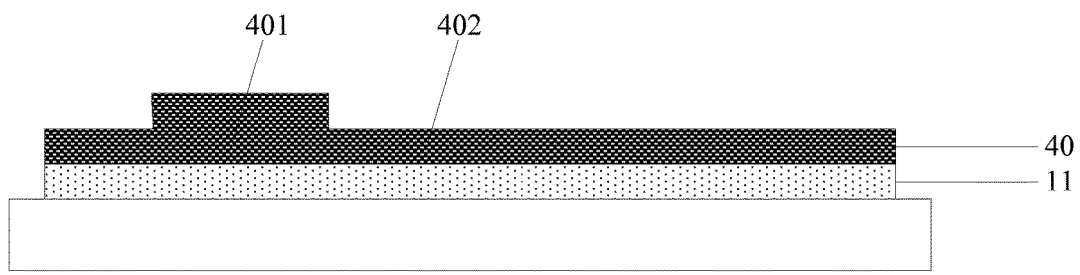

S203: as shown in FIG. 6(c), removing the semiconductor thin film 11 corresponding to the photoresist completely-removed portion 403 by an etching process.

Figure 6D:
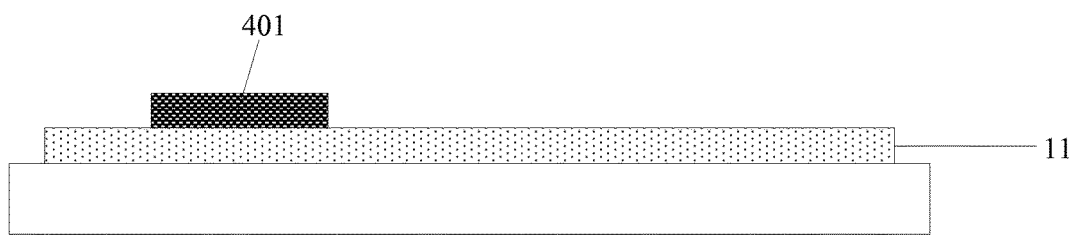

S204: as shown in FIG. 6(d), removing the photoresist 40 in the photoresist partially-retained portion 402 by an ashing process.

Figure 6E:
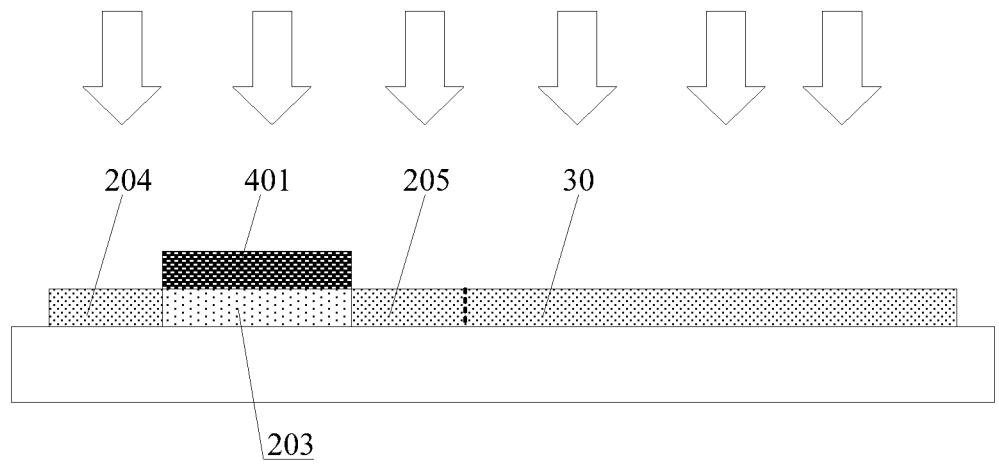

S205: as shown in FIG. 6(e), metallizing the semiconductor thin film 11, so that the exposed semiconductor thin film 11 is transformed into a film having conductor characteristics, to form the source electrode 204 and the drain electrode 205, as well as the pixel electrode 30 electrically connected with the drain electrode 205; and the semiconductor thin film 11 corresponding to the photoresist completely-retained portion 401 is not affected by the metallization, to form the semiconductor active layer 203.

Exemplarily, the semiconductor thin film 11 which is performed the metallization may be a metal oxide thin film and the metal oxide thin film may be transparent metal oxide material having semiconductor characteristics.

Herein, the transparent metal oxide material having the semiconductor characteristics includes at least one of indium gallium zinc oxide (IGZO), indium gallium oxide (IGO), amorphous indium tin zinc oxide (ITZO) and aluminum zinc oxide (AZO).

Figure 6F:
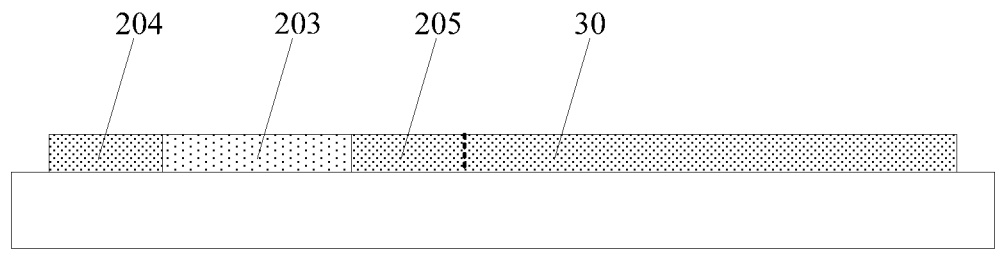

S206: as shown in FIG. 6(f), removing the photoresist 40 in the photoresist completely-retained portion 401 by a stripping process.

The semiconductor active layer 203, the source electrode 204 and the drain electrode 205, as well as the pixel electrode 30 electrically connected with the drain electrode 205 may be formed on the substrate, by the above-described steps S201-S206. Herein, the source electrode 204 and the drain electrode 205, as well as the pixel electrode 30 are made of the film which is metalized so as to have the conductor characteristics, and the semiconductor active layer 203 is made of the metal oxide thin film which is not metalized and has the semiconductor characteristics.

Figure 6G:
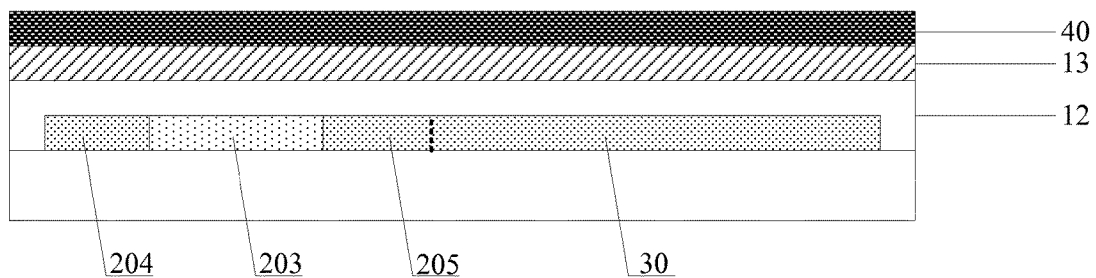

On the basis of the above-described steps, in a case that the array substrate 10 includes the top-gate-type thin film transistor 20, the forming a gate insulating layer 202 and a gate electrode 201 by one multi-tone mask process, may include:

S207: as shown in FIG. 6(g), forming a gate insulating layer film 12 and a metal film 13 sequentially on the substrate with the semiconductor active layer 203, the source electrode 204 and the drain electrode 205, as well the pixel electrode 30 formed thereon, and forming a photoresist 40 above the metal film 13.

Figure 6H:
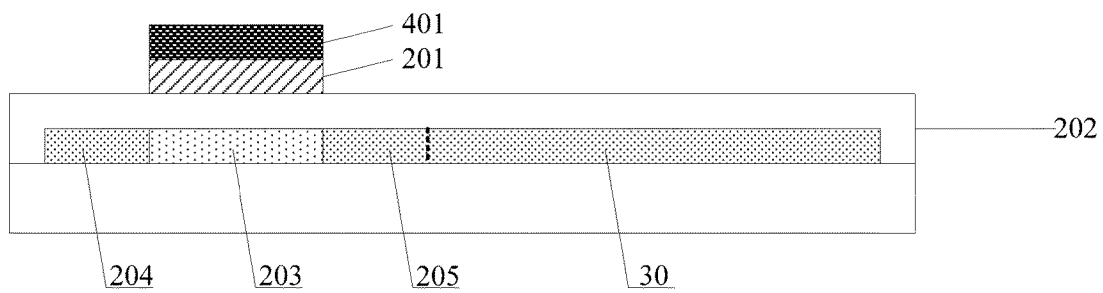

S208: as shown in FIG. 6(h), exposing and developing the substrate with the photoresist 40 formed thereon by using the multi-tone mask 50, to form the photoresist completely-retained portion 401, the photoresist partially-retained portion 402 and the photoresist completely-removed portion 403.

Herein, the photoresist completely-retained portion 401 corresponds to a region where the gate electrode 201, the gate line, and the gate line lead are to be formed (not shown), the photoresist completely-removed portion 403 corresponds to a through hole to be formed in a peripheral region (not shown), and the photoresist partially-retained portion 402 corresponds to other regions.

S209: removing the metal film 13 and the gate insulating layer film 12 corresponding to the photoresist completely-removed portion 403 by an etching process, to form the gate insulating layer 202 including the through hole (not shown); and then removing the photoresist 40 in the photoresist partially-retained portion 402 by an ashing process, and removing the corresponding metal film 13 below it by an etching process, to form the gate electrode 201, the gate line, and the gate line lead, etc.

S210: removing the photoresist 40 in the photoresist completely-retained portion 401 by a stripping process, to form the array substrate 10 shown with reference to FIG. 4.

The array substrate 10 provided by the embodiments of the invention is applicable not only to production of a twisted nematic liquid crystal display, but also to production of advanced-super dimensional switching (AD-SDS) liquid crystal display.

Figure 7:
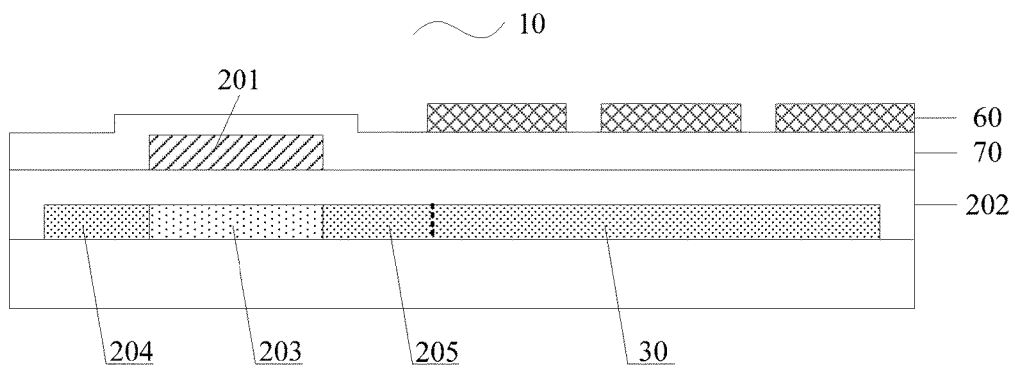
FIG. 7 is yet another structural schematic diagram of an array substrate provided by an embodiment of the invention.

On this basis, further, as shown in FIG. 7, the method further includes: forming a common electrode 60 on the substrate by one patterning process.

Herein, for the AD-SDS technology, the core technical feature may be described as follows: a multi-dimensional electric field is formed with an electric field produced at edges of slit electrodes on a same plane and an electric field produced between a layer of the slit electrodes and a layer of a plate-like electrode, so as to allow liquid crystal molecules at all alignment within a liquid crystal cell, which are provided directly above the electrode and between the slit electrodes, to be rotated, thereby enhancing the work efficiency of liquid crystal and increasing the transmissive efficiency. The advanced-super dimensional switching technology can improve the picture quality of TFT-LCD products, and has advantages such as high resolution, high transmittance, low power consumption, wide viewing angle, high aperture ratio, low chromatic aberration, push Mura-free, etc.

Hereinafter, an exemplary embodiment is provided to illustrate the manufacturing method of the array substrate 10 having the top-gate-type thin film transistor 20. The method includes the steps of:

S301: with reference to FIG. 6(a), depositing an indium gallium zinc oxide (IGZO) film with a thickness from 400 Å to 700 Å on a substrate by magnetron sputtering method, and coating a photoresist 40 on the IGZO film.

Herein, the IGZO film is a transparent metal oxide thin film having the semiconductor characteristics.

S302: with reference to FIG. 6(b), exposing and developing the substrate having the photoresist 40 formed thereon with the multi-tone mask 50, to form the photoresist completely-retained portion 401, the photoresist partially-retained portion 402 and the photoresist completely-removed portion 403.

Herein, the photoresist completely-retained portion 401 corresponds to a region where the semiconductor active layer 203 is to be formed, the photoresist partially-retained portion 402 corresponds to the region where the source electrode 204 and the drain electrode 205, as well as the pixel electrode 30 electrically connected with the drain electrode 205 are to be formed, and the photoresist completely-removed portion 403 corresponds to other regions.

S303: with reference to FIG. 6(c), removing the IGZO film corresponding to the photoresist completely-removed portion 403 by an etching process.

S304: with reference to FIG. 6(d), removing the photoresist 40 in the photoresist partially-retained portion 402 by an ashing process.

At this time, the IGZO film corresponding to the region where the source electrode 204 and the drain electrode 205, as well as the pixel electrode 30 are to be formed is exposed outside; and the IGZO film corresponding to the region where the semiconductor active layer 203 is to be formed still has its surface covered with the photoresist 40.

S305: with reference to FIG. 6(e), performing a plasma treatment on the above-described substrate, so that the exposed IGZO film having the semiconductor characteristics is transformed to the film having the conductor characteristics, so as to form the source electrode 204 and the drain electrode 205, as well as the pixel electrode 30 electrically connected with the drain electrode 205, the drain electrode 205 and the pixel electrode 30 being an integral structure.

At this time, the IGZO film located below the photoresist 40 does not undergo the plasma treatment, and still maintains the semiconductor characteristics thereof, so as to form the semiconductor active layer 203.

Exemplarily, the plasma treatment includes: placing the substrate having the metal oxide thin film exposed in a vacuum chamber, treating it with hydrogen plasma or oxygen plasma; while a pressure of the vacuum chamber is 1,000~2,000 mtorr, a gas-flow of hydrogen or oxygen is 5,000~15,000 sccm, and a power between two polar plates in the vacuum chamber is 1,500~2,500 W.

S306: with reference to FIG. 6(f), removing the photoresist 40 in the photoresist completely-retained portion 401 by a stripping process.

S307: as shown in FIG. 6(g), depositing a gate insulating layer film 12 and a metal film 13 sequentially on the substrate having the metal oxide semiconductor active layer 203, the source electrode 204 and the drain electrode 205, as well the pixel electrode 30 formed thereon by magnetron sputtering method, and coating a photoresist 40 on the metal film 13.

S308: as shown in FIG. 6(h), exposing and developing the substrate having the photoresist 40 formed thereon with the multi-tone mask 50, to form the photoresist completely-retained portion 401, the photoresist partially-retained portion 402 and the photoresist completely-removed portion 403.

Herein, the photoresist completely-retained portion 401 corresponds to a region where the gate electrode 201, the gate line, and the gate line lead are to be formed (not shown), the photoresist completely-removed portion 403 corresponds to a through hole to be formed in the peripheral region (not shown), and the photoresist partially-retained portion 402 corresponds to other regions.

S309: with reference to FIG. 6(h), removing the metal film 13 and the gate insulating layer film 12 corresponding to the photoresist completely-removed portion 403 by an etching process, to form the gate insulating layer 202 including the through hole (not shown); and then removing the photoresist 40 corresponding to the photoresist partially-retained portion 402 by an ashing process, and removing the corresponding metal film 13 below it by an etching process, to form the gate electrode 201, the gate line, and the gate line lead, etc.

S310: removing the photoresist 40 in the photoresist completely-retained portion 401 by a stripping process, to form the array substrate 10 shown in FIG. 4.

By the above-described steps S301-S310, the array substrate 10 comprising the top-gate-type thin film transistor 20 shown with reference to FIG. 4 may be obtained only by two patterning processes, which effectively reduces the number of the patterning processes, so as to enhance the capacity in mass production, and reduce the cost.

Further, with reference to FIG. 7, on the basis that steps S301-S310 are completed, the method may further include:

S311: forming a passivation layer 70 on the substrate by magnetron sputtering method.

S312: forming a common electrode 60 on the substrate having the passivation layer 70 formed thereon by one patterning process.

By the above-described steps S301-S312, the AD-SDS array substrate may be formed, which can effectively reduce the number of the patterning process, so as to enhance the capacity in mass production, and reduce the cost.

An embodiment of the present invention further provides a thin film transistor 20, with reference to FIG. 1 and FIG. 2, the thin film transistor 20 includes an active layer 203, as well as a source electrode 204 and a drain electrode 205 located on both sides of the active layer 203, wherein, the active layer 203, the source electrode 204 and the drain electrode 205 are disposed in the same layer.

Of course, the thin film transistor 20 further includes a gate electrode 201 and a gate insulating layer 202.

Here, a relative positional relationship of the gate electrode 201 and the active layer 203 is not limited. It should be noted that, the thin film transistor 20 may be of a top-gate-type structure, i.e., the gate electrode 201 is located above the active layer 203; or, the thin film transistor 20 may be of a bottom-gate-type structure, i.e., the gate electrode 201 is located below the active layer 203.

On the basis, optionally, material of the active layer 203 may be metal oxide material having semiconductor characteristics, e.g., transparent metal oxide material; and material of the source electrode 204 and the drain electrode 205 may be material which is obtained by metalizing the material of the active layer 203.

Further, optionally, the metal oxide material having the semiconductor characteristics includes at least one of IGZO, IGO, ITZO and AZO.

Exemplarily, with reference to FIG. 1, the thin film transistor 20 is a top-gate-type thin film transistor. That is, the gate insulating layer 202 and the gate electrode 201 are further disposed above the source electrode 204 and the drain electrode 205, as well as the active layer 203.

When the thin film transistor 20 is of the top-gate-type structure, it may be formed according to an order of firstly forming the active layer 203, the source electrode 204 and the drain electrode 205 by one patterning process, and then forming the gate insulating layer 202 and the gate electrode 201 by one patterning process. Thus, the thin film transistor 20 may be formed only by two patterning processes, which effectively reduces the number of the patterning process, so as to enhance the capacity in mass production, and reduce the cost.

An embodiment of the present invention further provides an array substrate 10, with reference to FIG. 4 and FIG. 5, the array substrate 10 including: a substrate; a plurality of data lines and a plurality of gate lines crossed each other; a plurality of pixel units, defined by the plurality of data lines and the plurality of gate lines crossed each other and arranged in a matrix form, each of the plurality of pixel units including the thin film transistor 20 as described above and a pixel electrode 30.

Optionally, the drain electrode 205 of the thin film transistor 20 is connected with the pixel electrode 30; the active layer 203, the source electrode 204 and the drain electrode 205 of the thin film transistor 20, as well as the pixel electrode 30 are disposed in the same layer; wherein, the drain electrode 205 and the pixel electrode 30 are an integral structure and made of the same material.

In a case that the array substrate 10 is an advanced super Dimensional switching (AD-SDS) array substrate, with reference to FIG. 7, the array substrate 10 may further include a common electrode 60.

It should be noted that, although in the above-described embodiments, illustration is provided with the drain electrode 205 being connected with the pixel electrode 30 as an example, yet those skilled in the art should understand that, due to interchangeability of the source electrode 204 and the drain electrode 205 of the thin film transistor 20 in terms of structure and composition, the source electrode 204 may also be connected with the pixel electrode 30, which belongs to equivalent transformation of the above-described embodiments of the invention.

An embodiment of the invention further provides a display device, including the above-described array substrate 10.

The display device provided by an embodiment of the invention may be: a liquid crystal panel, an electronic paper, a liquid crystal television, a liquid crystal display, an Organic Light Emitting Diode (OLED) display, a digital photo frame, a mobile phone, a tablet personal computer, and any other product or component having a display function.

Embodiments of the invention provide a manufacturing method of a thin film transistor, a manufacturing method of an array substrate and an array substrate, the manufacturing method of the thin film transistor including forming an active layer, a source electrode and a drain electrode on a substrate by one patterning process, the active layer, the source electrode and the drain electrode being located in the same layer. As compared with the prior art, the manufacturing method can effectively reduce the number of patterning processes, so as to enhance the capacity in mass production, and reduce the cost.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The present application claims priority of Chinese Patent Application No. 201310740724.5 filed on Dec. 27, 2013, the disclosure of which is incorporated herein by reference in its entirety as part of the present application.

What is claimed is:

1. A manufacturing method of a thin film transistor, comprising: forming an active layer, a source electrode and a drain electrode on a substrate by one patterning process comprising: coating a photoresist; exposing and developing the photoresist by using a multi-tone mask; and performing etching, ashing and metalizing by using the photoresist as the only mask, wherein
the active layer, the source electrode and the drain electrode being located in a same layer.

2. The manufacturing method according to claim 1, wherein the forming an active layer, a source electrode and a drain electrode on a substrate by one patterning process, comprises:
forming a semiconductor thin film on the substrate, and coating the photoresist on the semiconductor thin film;
exposing and developing the substrate with the photoresist formed thereon by using the multi-tone mask, to form a photoresist completely-retained portion, a photoresist partially-retained portion and a photoresist completely-removed portion, wherein the photoresist completely-retained portion corresponds to a region where the active layer is to be formed, the photoresist partially-retained portion corresponds to a region where the source electrode and the drain electrode are to be formed, and the photoresist completely-removed portion corresponds to other regions;
removing the semiconductor thin film corresponding to the photoresist completely-removed portion by an etching process;

removing the photoresist corresponding to the photoresist partially-retained portion by an ashing process;

metallizing the semiconductor thin film, so that exposed semiconductor thin film is transformed into a film having conductor characteristics, to form the source electrode and the drain electrode, and the semiconductor thin film corresponding to the photoresist completely-retained portion is not affected by the metallization, to form a semiconductor active layer; and removing the photoresist corresponding to the photoresist completely-retained portion by a stripping process.

3. The manufacturing method according to claim 2, wherein the metallizing the semiconductor thin film, comprises:

placing the substrate with the semiconductor thin film exposed in a reducing atmosphere, and performing a heating treatment on the same at 200~400° C.; or, placing the substrate with the semiconductor thin film exposed in a vacuum chamber, and treating the same by using hydrogen plasma or oxygen plasma, wherein a pressure of the vacuum chamber is 1,000~2,000 mtorr, and a gas-flow is 5,000~15,000 sccm.

4. The manufacturing method according to claim 3, wherein the semiconductor thin film which is metalized is a metal oxide thin film.

5. The manufacturing method according to claim 4, wherein the metal oxide thin film comprises transparent metal oxide material having semiconductor characteristics.

6. The manufacturing method according to claim 5, wherein the transparent metal oxide material having the semiconductor characteristics comprises at least one of indium gallium zinc oxide, indium gallium oxide, amorphous indium tin zinc oxide and aluminium zinc oxide.

7. The manufacturing method according to claim 1, further comprising: forming a gate insulating layer and a gate electrode above the active layer, the source electrode and the drain electrode by one patterning process on the substrate having the active layer, the source electrode and the drain electrode formed thereon.

8. The manufacturing method according to claim 1, before the forming the active layer, the source electrode and the drain electrode by one patterning process, further comprising: forming a gate electrode and a gate insulating layer sequentially on the substrate by two patterning processes.

9. A manufacturing method of an array substrate, comprising forming a thin film transistor and forming a pixel electrode, wherein the forming the thin film transistor comprises: forming an active layer, a source electrode and a drain electrode on a substrate by one patterning process comprising: coating a photoresist; exposing and developing the photoresist by using a multi-tone mask; and performing etching, ashing and metalizing by using the photoresist as the only mask, wherein the active layer, the source electrode and the drain electrode is located in a same layer.

10. The manufacturing method according to claim 9, wherein the pixel electrode electrically connected with the drain electrode and located in a same layer as the drain electrode is further formed, while the active layer, the source electrode and the drain electrode located in the same layer are formed on the substrate by one patterning process; and the drain electrode and the pixel electrode are an integral structure and made of a same material.

11. The manufacturing method according to claim 10, wherein the forming the active layer, the source electrode and the drain electrode located in the same layer, as well as the pixel electrode electrically connected with the drain electrode on the substrate by one patterning process, comprises:

forming a semiconductor thin film on the substrate, and forming the photoresist on the semiconductor thin film;

exposing and developing the substrate with the photoresist formed thereon by using the multi-tone mask, to form a photoresist completely-retained portion, a photoresist partially-retained portion and a photoresist completely-removed portion;

wherein the photoresist completely-retained portion corresponds to a region where a semiconductor active layer is to be formed, the photoresist partially-retained portion corresponds to a region where the source electrode and the drain electrode, as well as the pixel electrode electrically connected with the drain electrode are to be formed, and the photoresist completely-removed portion corresponds to other regions;

removing the semiconductor thin film corresponding to the photoresist completely-removed portion by an etching process;

removing the photoresist corresponding to the photoresist partially-retained portion by an ashing process;

metallizing the semiconductor thin film, so that exposed semiconductor thin film is transformed into a film having conductor characteristics, to form the source electrode and the drain electrode, as well as the pixel electrode electrically connected with the drain electrode; and the semiconductor thin film corresponding to the photoresist completely-retained portion is not affected by the metallization, to form the semiconductor active layer; and removing the photoresist corresponding to the photoresist completely-retained portion by a stripping process.

12. The manufacturing method according to claim 11, wherein the metallizing the semiconductor thin film, comprises:

placing the substrate with the semiconductor thin film exposed in a reducing atmosphere, and performing a heating treatment on the same at 200~400° C.; or, placing the substrate with the semiconductor thin film exposed in a vacuum chamber, and treating the same with hydrogen plasma or oxygen plasma, wherein a pressure of the vacuum chamber is 1,000~2,000 mtorr, and a gas-flow is 5,000~15,000 sccm.

13. The manufacturing method according to claim 12, wherein the semiconductor thin film which is performed the metallization is a metal oxide thin film.

14. The manufacturing method according to claim 13, wherein the metal oxide thin film comprises transparent metal oxide material having semiconductor characteristics.

15. The manufacturing method according to claim 14, wherein the transparent metal oxide material having the semiconductor characteristics comprises at least one of indium gallium zinc oxide, indium gallium oxide, amorphous indium tin zinc oxide and aluminium zinc oxide.

16. The manufacturing method according to claim 9, further comprising: forming a common electrode on the substrate by one patterning process.

* * * * *